United States Patent
Medina-Peralta et al.

(10) Patent No.: US 11,551,269 B1
(45) Date of Patent: Jan. 10, 2023

(54) SIMULATING BID REQUESTS FOR CONTENT UNDERDELIVERY ANALYSIS

(71) Applicant: Amazon Technologies, Inc., Reno, NV (US)

(72) Inventors: Jose Antonio Medina-Peralta, Huntington, NY (US); Yatin Sunil Deshpande, Jersey City, NJ (US); Rouzbeh Ghafouri, New York, NY (US); Binh D Vo, New York, NY (US); Unmil Tambe, Somerset, NJ (US)

(73) Assignee: Amazon Technologies, Inc., Seattle, WA (US)

( * ) Notice: Subject to any disclaimer, the term of this patent is extended or adjusted under 35 U.S.C. 154(b) by 761 days.

(21) Appl. No.: 15/673,175

(22) Filed: Aug. 9, 2017

(51) Int. Cl.
  *G06Q 30/00* (2012.01)
  *G06Q 30/02* (2012.01)
  *G06F 30/20* (2020.01)

(52) U.S. Cl.
  CPC ......... *G06Q 30/0275* (2013.01); *G06F 30/20* (2020.01); *G06Q 30/0277* (2013.01)

(58) Field of Classification Search
  None
  See application file for complete search history.

(56) References Cited

U.S. PATENT DOCUMENTS

| | | | | |
|---|---|---|---|---|
| 9,203,927 B1 * | 12/2015 | Mecklenburg | ..... | G06Q 30/0241 |
| 11,037,204 B1 * | 6/2021 | Medina-Peralta | | G06Q 30/0242 |
| 2006/0184421 A1 * | 8/2006 | Lipsky | ............... | G06Q 30/0273 |
| | | | | 705/14.42 |
| 2011/0246307 A1 * | 10/2011 | Zinkevich | .............. | G06Q 30/02 |
| | | | | 705/14.61 |
| 2012/0253945 A1 * | 10/2012 | Gao | .................... | G06Q 30/0275 |
| | | | | 705/14.71 |

(Continued)

FOREIGN PATENT DOCUMENTS

| | | | | |
|---|---|---|---|---|
| WO | WO-0139087 A2 * | 5/2001 | ............. | G06Q 30/02 |
| WO | WO-2014047197 A2 * | 3/2014 | ......... | G06Q 30/0241 |

OTHER PUBLICATIONS

Lee, Kuang-Chih, Ali Jalali, and Ali Dasdan. "Real time bid optimization with smooth budget delivery in online advertising." Proceedings of the seventh international workshop on data mining for online advertising. 2013. (Year: 2013).*

(Continued)

*Primary Examiner* — Michael Bekerman
(74) *Attorney, Agent, or Firm* — Hogan Lovells US LLP

(57) ABSTRACT

An analysis system may receive a request to determine a cause of underdelivery for an ad ("query content item"). Properties of the query content item can be processed through a matching model to determine properties of a bid request, thereby generating a bid request. The generated bid request also includes a request for the content server to return a report in response to the bid request regarding ad selection decisions. The bid request may be submitted to the content server, which causes the content server to define a set of candidate content items and select at least one of the candidate content items to submit bids on behalf of in response to the bid request. The content server also provides a report in regarding ad selection decisions. Thus, if the query content item is one of the ads that were not selected, the report may include factors contributing to the query content item not being selected.

20 Claims, 9 Drawing Sheets

(56) References Cited

U.S. PATENT DOCUMENTS

| | | | | |
|---|---|---|---|---|
| 2012/0316957 A1* | 12/2012 | Zhou | ............. | G06Q 30/0275 |
| | | | | 705/14.46 |
| 2013/0080265 A1* | 3/2013 | Francis | ............. | G06Q 30/0271 |
| | | | | 705/14.71 |
| 2014/0081742 A1* | 3/2014 | Katsur | ............. | G06Q 30/0241 |
| | | | | 705/14.46 |
| 2014/0108159 A1* | 4/2014 | Hughes | ............. | G06Q 30/0275 |
| | | | | 705/14.71 |
| 2015/0134464 A1* | 5/2015 | Bedirian | ............. | G06Q 30/0275 |
| | | | | 705/14.71 |
| 2016/0034972 A1* | 2/2016 | Koningstein | ...... | G06Q 30/0275 |
| | | | | 705/14.71 |
| 2016/0283974 A1* | 9/2016 | Sodomka | ............. | G06Q 30/0247 |
| 2016/0379243 A1* | 12/2016 | Kalish | ............. | G06Q 30/0242 |
| | | | | 705/14.41 |
| 2017/0330243 A1* | 11/2017 | Fuqua | ............. | G06Q 30/0275 |
| 2018/0108049 A1* | 4/2018 | Kitts | ............. | G06Q 30/0272 |

OTHER PUBLICATIONS

Salomatin, Konstantin, Tie-Yan Liu, and Yiming Yang. "A unified optimization framework for auction and guaranteed delivery in online advertising." Proceedings of the 21st ACM international conference on Information and knowledge management. 2012. (Year: 2012).*

* cited by examiner

SIMULATING BID REQUESTS FOR CONTENT UNDERDELIVERY ANALYSIS

BACKGROUND

Content publishers such as websites or web applications may designate a certain portion of their display interface as paid content space for displaying paid content such as advertisements, either as a primary or supplementary revenue source. In order to maximize such revenue, a publisher (e.g., an owner of a domain or application) may offer, through a bid request, a display instance of the paid content space to a paid content provider through an electronic bidding process. The winning paid content provider's content item is then displayed on the display interface of the content publisher for at least one instance. An electronic content server may facilitate the bidding process between the publisher and the paid content provider by selecting an appropriate content item in response to receiving a bid request from the publisher, and bidding on behalf of the paid content provider. The result of this process may be based on many factors, including certain properties of the content item and certain properties of the bid request. The paid content provider may pay per certain number of impressions or each time the content item is clicked on. The paid content provider may define certain cost parameters of a content item such as a maximum commitment amount (e.g., maximum bid price) for a certain number of impressions or a click, and a budget for the total amount to spend over a period of time. However, the situation may occur in which the budget defined for a certain content item is not being spent in its entirety, referred to as underdelivery. This may indicate that the paid content provider is not being effectively serviced by the content exchange and the content exchange is not generating optimal revenue.

BRIEF DESCRIPTION OF THE DRAWINGS

Various embodiments in accordance with the present disclosure will be described with reference to the drawings, in which.

DETAILED DESCRIPTION

Figure 1:
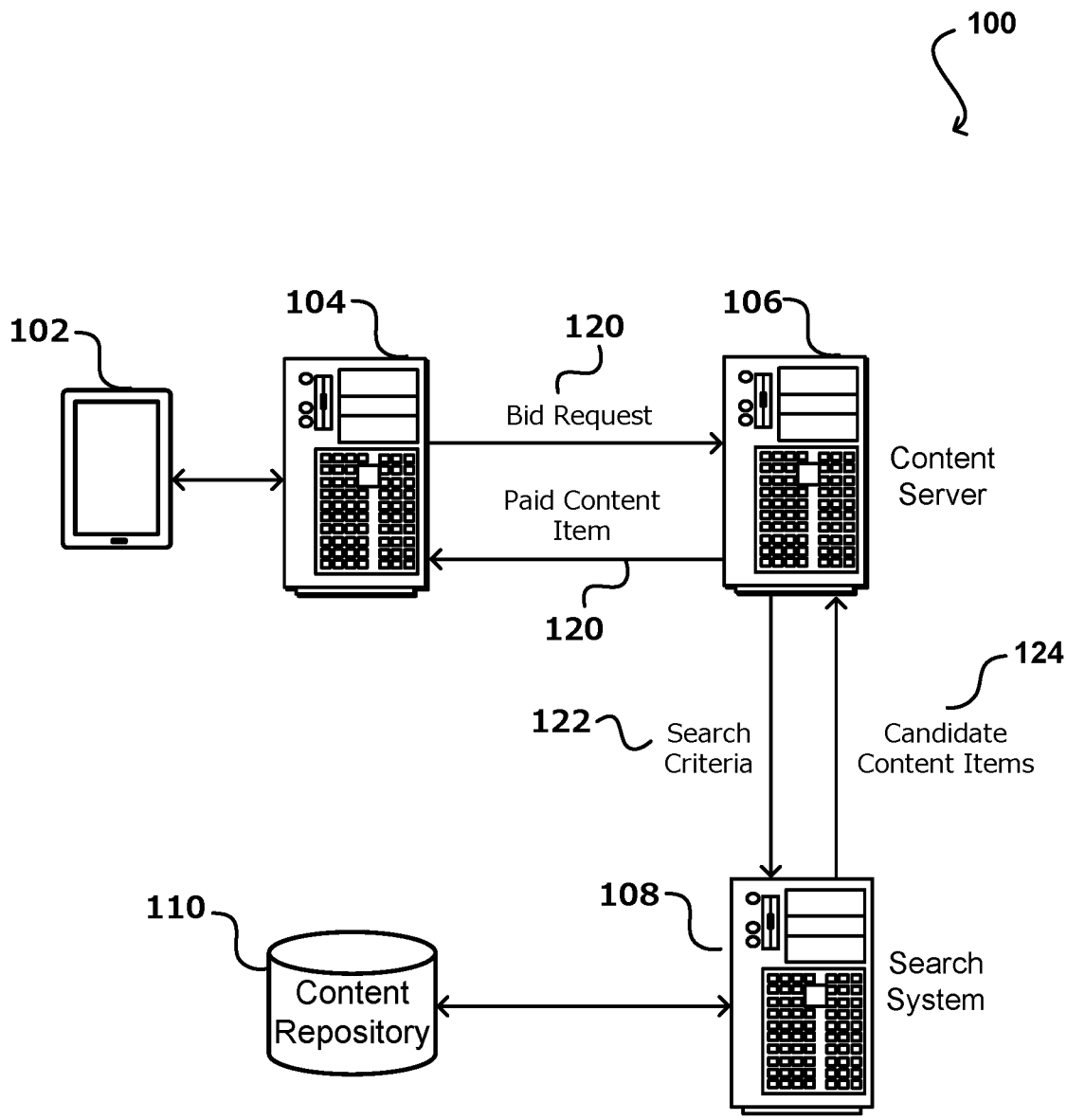
FIG. 1 illustrates an example environment for implementing aspects of the present disclosure in accordance with various embodiments.

Systems and methods in accordance with various embodiments of the present disclosure may overcome one or more of the aforementioned and other deficiencies experienced in conventional approaches to electronic paid content delivery. In particular, various embodiments attempt to resolve issues related to underdelivery of an electronic paid content item by a content exchange by determining a cause of the underdelivery. In accordance with an embodiment, underdelivery refers to a situation in which the budget set for a certain content item is not spent in its entirety. Underdelivery may occur when the content server representing the content item does not select the content item frequently enough for bidding in response to a bid request received from a publisher, or if the content item does not win the bid frequently enough. However, the reason why the content item is not being selected by the content server or winning bid requests may not be known or accessible. Without such information, it may be difficult for paid content providers or the content server to address the issue and resolve the underdelivery. The present disclosure presents an improvement in electronic content delivery technology by providing a means for identifying the cause of underdelivery of a content item by simulating bid requests and analyzing how the content server responds to the bid requests, and particularly with respect to the content item in question. In various embodiments, upon determining a cause of underdelivery, a parameter of the content item that can be adjusted to improve the delivery of the content item may be determined based on the determined cause. In some embodiments, the parameter and the adjustment that can be made can be presented as a recommendation or a recommended action for improving delivery of the content item. In some embodiments, such an adjustment may be made automatically. In some embodiments, the publisher may be represented by another entity, such as a content network. For such cases, the representing entity may be disregarded for purposes of the present discussion. That is to say, "publisher" may refer to the publisher itself or any entity or system representing the publisher or submitting bid requests on behalf of the publisher.

In various embodiments, an analysis system may receive a request to determine a cause of underdelivery for a certain content item ("query content item"). For example, the request may be initiated as a part of a trouble-shooting protocol, such as by a system or device associated with providing support and optimization functionality to entities such as paid content providers. For example, the request may be triggered as a first step in the trouble-shooting protocol for resolving suboptimal content delivery. The request may be initiated by a paid content provider who has noticed that a budget is not being fully spent and wants to know the root cause so rectifying adjustments can be made. Such a request may be made by the paid content provider via an application programming interface (API) or other means of communicating the request. The paid content provider may also make a request to the abovementioned system or device associated with providing support, which makes a request on behalf of the paid content provider, the request thereby being received by the analysis system. Alternatively, the request may be made by a content server automatically upon detecting that a content item that the content server represents is being underdelivered. The request to the analysis system may include an identifier of the query content item, through which properties of the query content item can be accessed. The identifier or the properties directly can be processed through a matching model to determine properties of a bid request, and thereby generating the bid request based on the properties of the query content item. The matching model may include matching rules that express estimated relationships between certain content item properties and bid request properties. Content item properties may include, for example, targeting expressions, commitment value (e.g., bid price) information, ranking scores, size (e.g., pixel dimensions), the number of historical bids, clicks, and/or purchases, for example, resulting from the paid content item being presented, frequency caps, and/or pacing information, among many others. Bid request properties may include information about a user operating the computing device invoking the bid request and on which the winning content item is to be displayed, such as any behavioral or user segments that may describe various attributes of the user including, for example, demographics, gender, age, purchase history of products and/or services from various sources, any web content that is browsed or accessed by the user, paid content items or content in which the user demonstrated interest (e.g., through clicks, conversions, etc.), among other information. The bid request properties may also include data regarding the paid content space, such as the size (e.g., pixel dimensions), the content surrounding the paid content space, information regarding the publisher (e.g., publisher category, target audience), and other requirements such as cost per click, pace, frequency caps, among others. A content server may select relevant content items from a repository or network of content items in response to the bid request. Specifically, the content server may have specific logic or rules that the content server uses to select content items that are relevant for bid requests based on their respective properties. In some embodiments, the matching model may include the exact logic and rules of the content server if such information is available, such as in the scenario of the content server and the analysis system belonging to the same entity or system. In some other embodiments, if the exact information is not available, the match model may include an estimation of the logic and rules of the content server. In such a scenario, the match model may be determined by reverse engineering the logic and rules of the content server. For example, the logic and rules of a content server may be estimated by analyzing relationships between properties of bid requests submitted to the content server and properties of content items selected by the content server in response to the bid requests.

In either case, properties of a bid request may be determined through the matching model based on the properties of the query content item. The properties of the bid request may be used to populate a bid request schema or template in order to generate a bid request that can be processed through the content server as if the bid request were a live production bid request coming from a publisher. In various embodiments, the generated bid request also includes a request for the content server to return a report in response to the bid request that indicates which content items were considered to be selected for the bid request, a reason why a certain content items was ultimately selected for bidding, and respective reasons why the other considered content items were ultimately not selected for bidding. In various embodiments, the report may be expressed in various formats. For example, the report may include raw data expressed as computer-readable code, an array of items, a populated schema, a string, and the like. In various embodiments, raw data may be converted to a user friendly format that can be read or understood easily by an operator. The reasons may be expressed as factors related to certain properties of the content item. For example, the factors may be related to targeting expressions, the maximum cost per click, historical performance information, content of the content items, information related to the paid content provider, size or resolution, among others. A request for the content server to return such a report may be set as one of the properties of the generated bid request.

The bid request generated by the analyzer system may be processed through the content server, which causes the content server to define (e.g., find, obtain, determine) a set of candidate content items and select at least one of the candidate content items to submit bids on behalf of in response to the bid request. The analyzer may also receive the abovementioned report from the content server, which may include factors contributing to respective content items being selected ("selected content items") or not selected ("unselected content items") by the content server. Thus, if the query content item is one of the content items that were not selected, the report would include factors contributing to the query content item not being selected, which may provide insight into the cause of underdelivery of the query content item. In various embodiments, different bid requests may be generated and submitted to the content server with respect to the query content item in order to obtain more insight into the cause of underdelivery of the query content item. Other advantages, variations, and functions are described and suggested below as may be provided in accordance with the various embodiments.

FIG. 1 illustrates an example environment 100 for implementing aspects of the present disclosure in accordance with various embodiments. Paid content item selection can be performed through electronic auctions that may be held through an electronic content exchange. Typically, content publishers ("publishers") can create opportunities for displaying electronic paid content items with their content (e.g., web pages, web app). Publishers can provide such opportunities independently or be represented by a content network. For example, when a user accesses a website of a publisher, the server hosting the website can send a paid content request (e.g., bid request) for content providers to bid for the right to display their content item on the website. This request may be received by the content exchange. The bid request may include information describing the website, publisher, and/or the user. Once the bid request is received by the content server, paid content providers can bid to fill that request with their paid content item. Paid content providers can utilize content campaigns (e.g., ad campaign) that define various criteria for bidding on a paid content request, such as data (e.g., user attributes, categories, etc.) describing an audience targeted by the ad campaign, duration of the ad campaign, geographic locations and/or content networks to which their content items are provided, maximum commitment values, etc. Such information can be utilized by various bidding algorithms to determine whether a paid content provider bids on the auction depending on the contextual information (e.g., descriptions of a user and/or publisher) that is included with the bid request. Once a winner is determined, the paid content item designated by the winning paid content provider is then provided in response to the request and, subsequently, displayed to the user on the website of the publisher. The displaying of the content item is counted as an "impression."

The example environment 100 illustrates a user operating a computing device 102 to electronically access content (e.g., a website, web page, or web application) from the publisher 104. Upon determining that the computing device 102 is accessing content, the publisher 104 can send, to an electronic content exchange, which includes a content server 106 and a search system 108, a request 120 for a paid content item to be provided to the computing device 104 along with the content being accessed.

The request 120 can include information about the user operating the computing device 102, such as any behavioral or user segments that may describe various attributes of the user including, for example, demographics, gender, age, purchase history of products and/or services from various sources, any web content that is browsed or accessed by the user, paid content items or content in which the user demonstrated interest (e.g., through clicks, conversions, etc.), among other information. In some embodiments, the request 120 can reference user information (e.g., a user identifier) and such information can be used to obtain additional details about the user (e.g., behavioral and/or user segments). For example, the user information may reference a user identifier that can be used to access or obtain a digital profile corresponding to the user. Further, this digital profile may store information about the user being targeted by the paid content items, such as behavioral and/or user segments describing various attributes of the user. These segments may have been determined to correspond to the user based on various actions taken by the user (e.g., content accessed, paid content items clicked, conversions resulting from paid content item clicks, web browsing history, etc.).

The content server 106 can use such information to identify or obtain paid content items that are responsive to the segments provided with the request and, as a result, identify or obtain paid content items that are determined to be most relevant to the user operating the computing device 102. In various embodiments, the search system 108 can access a content item repository 110 to search for candidate paid content items responsive to the bid request 126. The content item selection and result of this process may be based on many factors, including certain properties of the content item and certain properties of the bid request. In various embodiments, the content server 106 can determine search criteria based on the bid request and send the search criteria to the paid content item search system 108 to identify and send the most relevant candidate paid content items 122. For example, identifying the candidate paid content items 122 may be based on various criteria such as the size of the paid content item slot, pacing, ranking, frequency caps, to the content server, along with other information (e.g., commitment value for the paid content item). In various embodiments, the paid content items 124, or paid content item identifiers provided by the search system 108 can each be associated with a respective score, depending on the implementation, such scores can be used to rank and/or determine respective commitment values for the paid content items. The content server 106 may select a paid content item 126 among the candidate content items to send to the publisher in response to the bid request, for example, through conducting an electronic auction.

In FIG. 1, the publisher 104, the content server 106, and the search system 108 are able to utilize respective computing systems and/or devices to interact with one another through a network, for example, a local area network (LAN) or wide area network (WAN), e.g., the Internet. Similarly, users are able to utilize their respective computing devices 102 to access content (e.g., websites) that may be offered through the publisher 104 over the network. Such publishers 104 can provide content (e.g., web pages, etc.) that is accessible over the network (e.g., the Internet). For example, a publisher 104 may utilize one or more computing systems to provide a website that is accessible through the network.

The publisher's website may offer opportunities to present additional content to users accessing the website, for example, in the form of electronic paid content items. The computing devices and/or systems for each of the computing device 102, publisher 104, content server 106, and search system 108 will each generally include memory for storing instructions and data, and at least one processor for executing the stored instructions. The content server 106 and the search system 108 are illustrated as being implemented on separate computing systems, however, in some embodiments, the content server 106 and the search system 108 can be implemented within the same computing system. The search system 108 can communicate with a data store that stores data describing various paid content items. Such data can include paid content items, or references to the paid content items, along with information related to the paid content items such as respective targeting expressions, commitment value information, ranking scores, size (e.g., pixel dimensions) of the paid content item, the number of bids, clicks, and/or purchases, for example, resulting from the paid content item being presented, frequency caps, and/or pacing information, to name some examples.

As mentioned, the search system 108 can determine candidate paid content items that are responsive to a bid request 120 and can send the candidate content items 124, or the paid content item identifiers, along with other information (e.g., respective commitment values for the paid content items) to the content server 106. In various embodiments, the paid content items determined to be responsive can be associated with respective scores and such scores can be used to determine respective commitment values for and selection of the paid content items, for example, as well as to rank the paid content items. Weights may be applied to the certain properties associated with the paid content items. A ranking function can be applied to the paid content items determined to be responsive to the bid request 120. The ranking function can be defined using historical data (e.g., click feedback, purchase feedback, etc.) so that a score for a paid content item is associated with a probability that the paid content item will be clicked. This information can be incorporated into the function so that the function maps a score associated with the paid content item. The score may also include a probability of clicks and/or purchases, depending on the implementation. In various embodiments, the content server 106 and/or the search system 108 can determine respective boosting factors for paid content items, for example, by using historical click feedback and/or purchase feedback to determine the rate or percentage of clicks and/or purchases when an paid content item was returned for a user having certain segments and/or satisfying certain targeting expressions. Such analysis can determine, for example, how valuable a targeting expression was in computing a click and/or purchase. Such scores and factors, among other information, determined for the paid content items with respect to the bid request 120 can be used to determine which paid content items to send to the content server 106 and ultimately to bid on behalf of in response to the bid request from the publisher.

Figure 2:
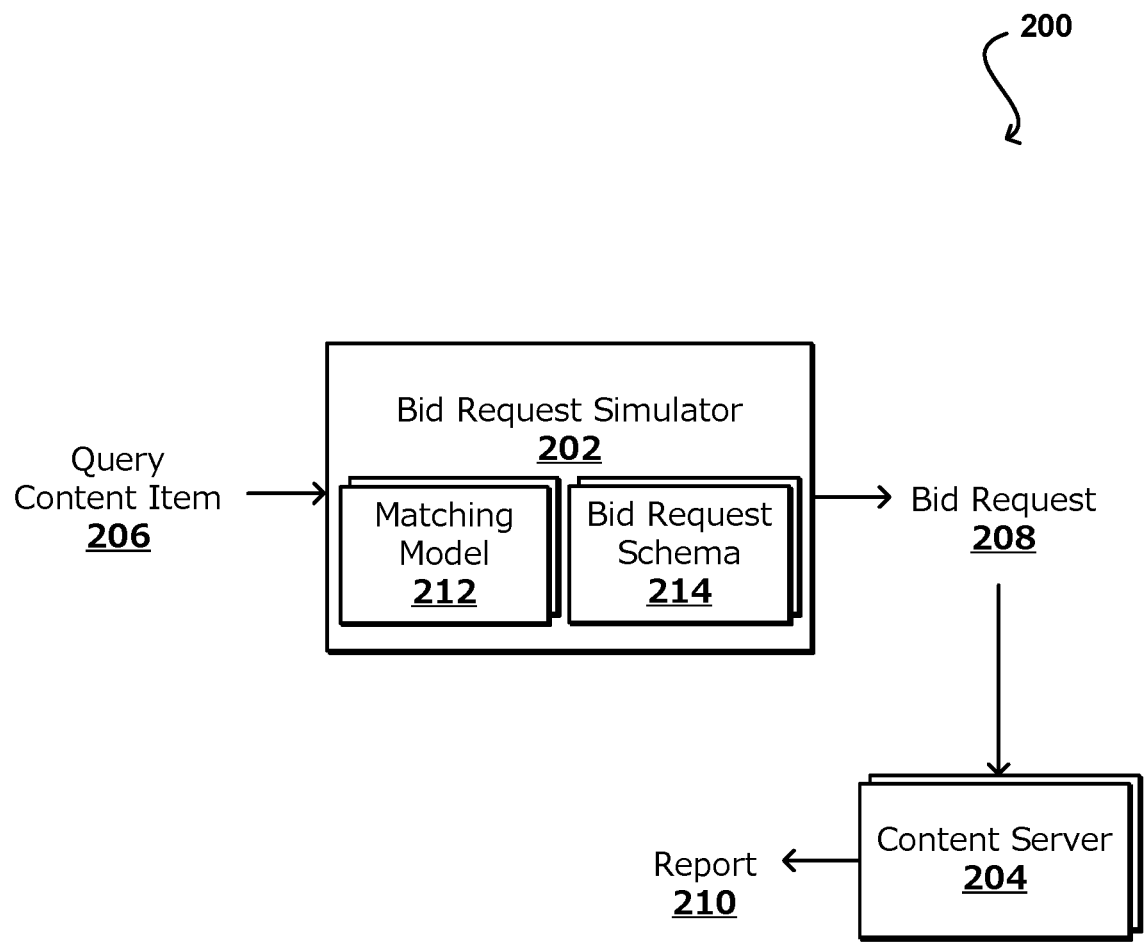
FIG. 2 illustrates an example system for carrying out functions, in accordance with various embodiments.

In various embodiments, a winning paid content item may be displayed by the publisher, and the paid content provider may pay per certain number of impressions or each time the content item is clicked on. The paid content provider may define certain cost parameters of a content item such as a maximum bid amount for a certain number of impressions or a click, and a budget for the total amount to spend over a period of time. However, the situation may occur in which the budget defined for a certain content item is not being spent in its entirety, referred to as underdelivery. This may indicate that the paid content provider is not being effectively serviced by the content server and the content server is not generating optimal revenue. In various embodiments, underdelivery may occur when the content server representing the content item does not select the content item frequently enough for bidding in response to a bid request received from a publisher, or if the content item does not win the bid frequently enough. However, the reason why the content item is not being selected by the content server or winning bids may not be known or accessible. Without such information, it may be difficult for paid content providers to address the issue and resolve the underdelivery. Accordingly, in accordance with various embodiments, the present disclosure presents an improvement in electronic advertising technology by providing a means for identifying the cause of underdelivery of an content item by simulating bid requests and analyzing how the content server responds to the bid requests FIG. 2 illustrates an example system 200 for carrying out functions according to various embodiments. As shown, the system 200 may include a bid request simulator 202 communicative with an electronic content exchange 204. The functions of system 200 may be invoked upon receiving a request to determine a cause of underdelivery for a certain content item ("query content item"). Although the function system 200 is shown in a single system, the function system 200 may be hosted on multiple server computers and/or distributed across multiple systems. Additionally, the modules may be performed by any number of different computers and/or systems. Thus, the modules may be separated into multiple services and/or over multiple different systems to perform the functionality described herein. In various embodiments, the request may invoke a serverless function to perform the various steps described herein. The request may be initiated by an paid content provider who has noticed that a budget for a certain content item is not being fully spent and wants to know the root cause so rectifying adjustments can be made. Alternatively, the request may be made by an electronic content exchange 204 automatically upon detecting that a content item ("query content item") that the content server represents is being underdelivered.

Certain information associated with the query content item 206 may be received by the bid request simulator 202, such as identifying data (e.g., identifier, client facing identifier) by which the query content item is uniquely referenced. Additional properties of the query content item may be accessed via the identifier and received by the bid request simulator 202. In some embodiments, the bid request simulator 202 may utilize the content item identifier to access the content item and scan the data representation of the query content item to obtain the content item properties. In other embodiments, the content item properties may be formatted in way ready to be input into bid request simulator 202. Content item properties may include various parameters that define the ad, such as targeting expressions, commitment value information, ranking scores, size (e.g., pixel dimensions), the number of historical bids, clicks, and/or purchases, for example, resulting from the paid content item being presented, frequency caps, and/or pacing information, information regarding the content of the ad, information regarding the paid content provider, among others. In some embodiments, the bid request simulator 202 may include a matching model 212 which can take as input, properties of a content item and output corresponding properties of a bid request associated with the ad. The matching model 212 may include matching rules that express estimated relationships between certain content item properties and bid request properties. The matching model 212 may include or be referred to as a rules repository, rules/matching recipes, knowledge graph, matching rules, and the like. In some embodiments, the matching rules can be input into the bid request simulator 202 along with the identifier or properties of the query content item. A content server may have specific logic or rules that the content server uses to select ads for bid requests, which are modeled by the matching model. Different content server systems or entities may have different logic or rules. Thus, the matching model 212 may be specific to the content server system representing the query content item. In some embodiments, the matching model may include the exact logic and rules of the content server if such information is available, such as in the scenario of the content server and the analysis system belonging to the same entity or system. In some other embodiments, if the exact information is not available, the match model 212 may include an estimation of the logic and rules of the content server. In such a scenario, the match model 212 may be determined by reverse engineering the logic and rules of the content server. For example, the logic and rules of a content server may be estimated by analyzing relationships between properties of bid requests submitted to the content server and properties of ads selected by the content server in response to the bid requests, respectively. In various embodiments, the reverse engineered logic and rules may not be complete and thus not exactly replicate the actual logic and rules of the content server. In such and other cases, the reverse engineering logic and rules may be fine-tuned by feedback training data collected from user-annotations of the generated bid request properties or other observations and data collected during use. In some embodiments, certain rules may be manually adjustment, changed, removed, added, or replaced.

Using the matching model and the properties of the query content item, the bid request simulator 202 can determine properties of a bid request relevant to the query content item. Properties of the bid request may include information about a user operating the computing device on which the request was made and on which the winning content item is to be display, such as any behavioral or user segments that may describe various attributes of the user including, for example, demographics, gender, age, purchase history of products and/or services from various sources, any web content that is browsed or accessed by the user, paid content items or content in which the user demonstrated interest (e.g., through clicks, conversions, etc.), among other information. The bid request properties may also include data regarding the electronic content space, such as the size (e.g., pixel dimensions), the content surrounding the electronic content space, information regarding the publisher (e.g., publisher category, target audience), and other requirements such as cost per click, pace, frequency caps, among others.

In some embodiments, the content server 204 may utilize a specific bid request schema 214 or template, which defines a certain format for a bid request that can be processed by the content server. A bid request that can be submitted to the content server includes the bid request schema populated with bid request properties. Similar to the matching model, the bid request schema may be included in the bid request simulator 202 or the bid request schema may be an input into the bid request simulator 202 along with the properties of the query content item. Thus, in some embodiments, the bid request simulator 202 may be a general simulator that can receive inputs that define the properties of the query as well as aspects of the content server (i.e., matching model, bid request schema). In some other embodiments, the bid request simulator 202 may be content server specific and is already configured with the specific aspects of the content server (i.e., matching model, bid request schema). The bid request simulator 202 may populated the appropriate bid request schema with the properties of the bid request to generator a bid request 208 that can be processed through the content server 204 as if the bid request were a live production bid request coming from a publisher. Thus the output of the bid request simulator 202 is a bid request relevant to the query content item. In various embodiments, the generated bid request also includes a request for the content server to return a report in response to the bid request that indicates which ads were considered to be selected for the bid request, a reason why a certain content item that was ultimately selected, and respective reasons why the other considered ads were ultimately not selected for the bid request. The reasons may be expressed as factors related to the properties of the ads. For example, the factors may be related to targeting expressions, the maximum cost per click, historical performance information, content of the ad, information related to the paid content provider, size or resolution, or any other properties of the query content item as well as other data associated with the query content item. A request for the content server to return such a report may be set as one of the properties of the generated bid request. In some embodiments, the content server may include a built-in function for returning such a report along with a selected content item in response to a bid request. In some such cases, this function is provided as a setting, in which the report can be optionally provided based on a selection of the setting in the bid request. Thus, in such cases, the request for the content server to return the report may be in the form of the appropriate selection of the setting.

The bid request 208 generated by the bid request simulator 202 may be submitted to the content server that represents the query content item and from which the matching model and bid request schema was derived. The content server may receive the bid request as if the bid request were a real bid request coming from a publisher, and thus process the bid request in the same way. Thus, the content server may define a set of candidate content items from its repository of ads and select at least one of the candidate content items to submit bids on behalf of in response to the bid request. The content server may return the abovementioned report 210 from the content server, which may include factors contributing to respective ads being selected or not selected by the content server to bid on behalf of in response to the bid request. Thus, if the query content item is one of the ads that were not selected, the report would include factors contributing to the query content item not being selected, which may provide insight into the cause or reasons of underdelivery of the query content item. Such a report can serve as an analysis result in response to the request to analyze underdelivery of the query content item. In various embodiments, a plurality of different bid requests may be generated by the content server based on the query content item and submitted to the content server. Accordingly, the content server determines a set of candidate content items and a report for each bid request. Thus, a plurality of cases in which the query content item was not selected and the associated factors can be aggregated and analyzed in order to obtain more insight into the cause of underdelivery of the query content item. In some embodiments, certain adjustments may be made to the properties of the query content item, such as certain targeting parameters or content contained therein. The adjusted query content item may be tested to determine if the adjustments positively impact delivery of the query content item. The identifier or properties of the adjusted query content item may be input into the bid request simulator 202 to generate a bid request. Alternatively, a bid request previously generated based on the original query content item properties may be used. The bid request can be submitted to the content server to see if the query content item is selected by the content server to bid on behalf of. All or a portion of these techniques can contribute to resolution of content underdelivery issues.

In some embodiments, the bid request simulator 202 may include a machine learning model such as, but not limited to, a neural network. In such embodiments, the neural network may be trained using training data, which include a plurality of input-output pairs. An input-output pair may include a bid request received by the content server as the input and a set of candidate content items, which includes the content item that is ultimate selected by the content server to bid on behalf of and the ads that are not selected, as the output. In some embodiments, the neural network may be trained with the candidate content items as the input and the bid request as the output. Thus, a relationship between bid requests and content item selection can be learned and simulated by the matching model. In some embodiments, bid request generated by the bid request simulator 202 may be adjusted by an annotator before the bid request is submitted to the content server. This may be done to edit a certain property or adjust a certain property of the bid request. For example, it may be the case that when bid request generated by the bid simulator is submitted to the content server, the candidate content items selected by the content server does not include the query content item, and thus the report returned by the content server may not include factors related to the query content item. It may be hypothesized that a certain parameter of the bid request is too narrow or out of range to cause the content server to consider the query content item as a candidate content item, and thus the parameter can be updated to be broader or have a different range. The adjusted bid request may be processed through the content server again to determine factors contributing to the selection result of the query content item by the content server. Such edits or adjustments made to a bid request generated by the matching model may be recorded as annotations and used to further train and refine the matching model.

In various embodiments, the bid request simulator 202 may include multiple matching models 212 and multiple bid request schemas 214 that correspond respectively to multiple content servers 204. The bid request simulator 202 may be able to determine a cause of underdelivery with respect to different content servers 204, and different content servers 204 may have different logic and rules for selecting and serving content items as well as different protocols and formats for handling bid requests. Thus, in order to provide underdelivery diagnosis for different content servers 204, the bid request simulator 202 has access to the appropriate matching models 212 and bid request schemas 214 appropriate for the different content servers 204. For example, when the big request simulator 202 receives the query content item 206, the bid request simulator 202 may also receive information regarding or otherwise configured to diagnosis the query content item 206 with respect to a specific content server 204 of a plurality of content servers 204. Thus, the bid request simulator 202 may select the associated matching model 212 and the appropriate bid request schema 214 associated with the specific content server 204. Furthermore, the content servers 204 may belong to different entities, serve different marketplaces and publisher, and/or be hosted on different machines or in a "serverless" hosting environment such as a "cloud" computing environment. The bid request simulator 202 may be access by multiple users or systems at the same time, such that a plurality of query content items can be respectively processed simultaneously.

Figure 3:
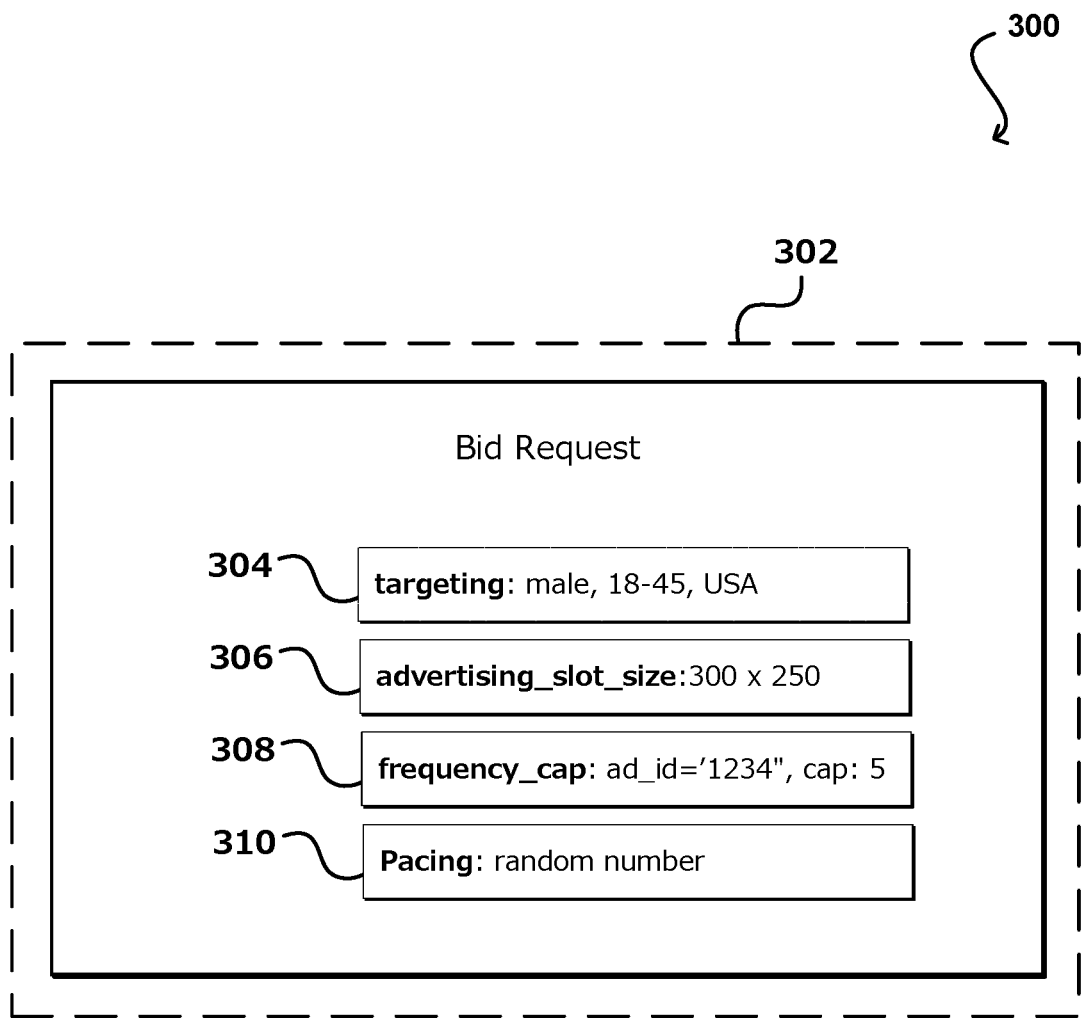
FIG. 3 illustrates an example representation of a bid request generated by the bid request simulator, in accordance with various embodiments.

FIG. 3 illustrates an example representation 300 of a bid request generated by the bid request simulator 202 of FIG. 2 in accordance with various embodiments. The bid request 302 may include parameters that can be utilized by a search system of the content server to determine and retrieve ads from a repository of ads that are relevant to the bid request 302, such as based on the properties of the bid request. The bid request 302 may include, for example, various information about a user 304 being targeted with paid content items such as behavioral or user segments 306 describing various attributes. Each segment may indicate some information relating to user demographics, gender, age, geographic information, purchase history of products and/or services from various sources, any web content that is browsed or accessed by the user, paid content items or content in which the user demonstrated interest (e.g., through clicks, conversions, etc.), among other information. The electronic content exchange can use such information to identify or obtain paid content items that are responsive to the segments provided with the request.

In various embodiments, the bid request 302 may also include electronic content space information 306 describing the size of the advertising slot for which a paid content item is to be fitted. The size of the advertising slot can typically be provided by the computing device of the publisher as part of the paid content item request.

The bid request 302 can optionally include information identifying or describing any frequency caps 308 associated with paid content items. A frequency cap can be used to control the number of times a paid content item is returned from the search system as being responsive to the bid request 302. In some embodiments, the information specifies the number of impressions for a paid content item, or paid content item identifier, and the search system is able to determine, based on any frequency caps (e.g., maximum number of impressions) associated with that paid content item, or paid content item identifier, whether or not that paid content item is responsive. In some embodiments, the information specifies the respective frequency caps associated with an paid content item or paid content item identifier and the search system is able to determine, based on a number of impressions corresponding to the paid content item, or paid content item identifier, whether to return the paid content item or paid content item identifier in response to the bid request 302.

In various embodiments, the electronic content exchange and/or the search system can be configured to regulate the delivery of paid content items that are associated with pacing constraints 310. For example, a paid content provider may purchase 7,000 impressions for an advertising campaign that runs for one week. The paid content provider may prefer to spread the 7,000 impressions across the one week advertising campaign evenly (e.g., 1,000 impressions per day), or within some threshold proportion spread across the week. Pacing can be implemented to address such constraints so that, for example, all 7,000 impressions are not satisfied prior to completion of the one week advertising campaign. In some implementations, a pacing factor for a paid content item can be utilized to pace the delivery of the paid content item. The pacing factor may be stored, for example, in the search index or in a data store. The pacing factor indicates a probability that the paid content item should be returned or delivered in response to a bid request. Generally, the pacing factor for a paid content item that is not associated with any pacing constraints is set to "1," which means the paid content item is always returned if determined to be responsive to a bid request. However, if the delivery of a paid content item is exceeding the pacing constraints, then the pacing factor can be manipulated to reduce the delivery of the paid content item. For example, to reduce the return rate for a paid content item to 10 percent, the pacing factor can be set to "0.1".

To implement pacing, a random number between "0" and "1" can be included in the bid request 302 and the search system is configured to return paid content items having a respective pacing factor that is within the random number. Having a query with a random number and having each paid content item be associated with a pacing factor between "0" and "1" results in the search system sampling the paid content items at the frequency that is equal to, or approximately equal to, the pacing factor corresponding to the paid content items. In one example, a paid content item associated with a pacing factor of 0.1, so the goal is to return that paid content item in response to 10 percent of requests. Assuming 100,000 requests are received, then 10 percent of those requests will be associated with a random number that is between 0 and 0.1, which would therefore allow the system to return the paid content item 10 percent of the time.

In various embodiments, to facilitate this approach, the electronic content exchange and/or the search system can adjust the respective commitment value of a paid content item to evaluate changes to the pacing factor for that paid content item, for example, in terms of whether the pacing factor gets closer to "0" or closer to "1". If the pacing factor gets close to "0", then the commitment value for the paid content item can be decreased so that the paid content item does not show up very often, for example, as an impression. Further, if the pacing factor gets close to "1", then the commitment value for the paid content item can be increased so that the paid content item is shown more often, for example, as a result of winning more impressions. An update function can be utilized to facilitate this process by, for example, adjusting the respective pacing factors for paid content items based on the corresponding number of impressions and bids for a particular paid content item. Such adjustment for a paid content item can be performed, for example, by computing an error between the number of times the paid content item has been shown as an impression, and the number of times the paid content item is supposed to be shown as an impression. The paid content request 302 may include many other or different types of parameters than those illustrated in the example representation of FIG. 3. The bid request 302 may also be represented according to the appropriate bid request schema associated with the electronic content exchange.

Figure 4:
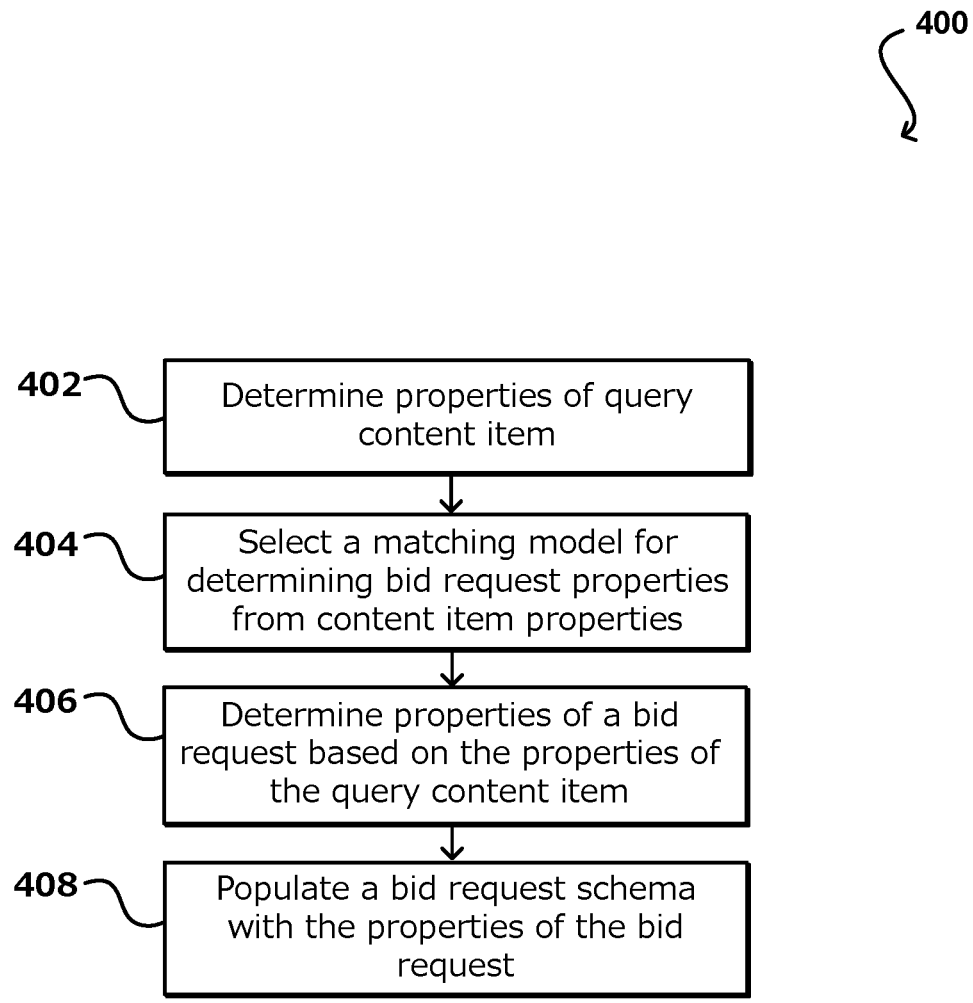
FIG. 4 illustrates a flow diagram of an example process for generating a bid request, in accordance with various embodiments

FIG. 4 illustrates a flow diagram of an example process 400 for generating a bid request based on a query content item, such as a query content item, in accordance with various embodiments. The example process 400 is provided merely as an example and additional or fewer steps may be performed in similar or alternative orders, or in parallel, within the scope of the various embodiments described in this specification. Upon being invoked to generate a bid request based on a content item, such as by receiving a request, an analyzer system can determine 402 the properties of the query content item. The properties may be provided to the analyzer as direct inputs that are already formatted in a way that is recognizable and can be processed by the analyzer. The properties may be obtained by the analyzer by scanning a data representation of the content item into order to extract the properties.

A matching model may be selected 404 for determining bid request properties based on content item properties, in which the matching model includes a set of matching rules that related bid request properties and content item properties. In various embodiments, different matching models may be used for different systems of applications. Thus, in certain embodiments, the appropriate matching model for the query content item may be selected 404. The matching model is configured to simulate the logic and rules of a content server system, such as a content server, associated with the query content item. In some embodiments, the matching model may include the exact logic and rules of the content server if such information is available, such as in the scenario of the content server and the analysis system belonging to the same entity or system. In some other embodiments, if the exact information is not available, the match model may include an estimation of the logic and rules of the content server. In such a scenario, the match model may be determined by reverse engineering the logic and rules of the content server. For example, the logic and rules of a content server may be estimated by analyzing relationships between properties of bid requests submitted to the content server and properties of content items selected by the content server in response to the bid requests, respectively.

As described, the matching model may include a machine learning model, in which case the step of defining 404 the matching model may include training the matching model using training data, which may include a plurality of input-output pairs. An input-output pair may include a bid request received by the electronic content exchange as the input and a set of candidate content items, which includes the content item that is ultimate selected by the electronic content exchange to bid on behalf of and the ads that are not selected, as the output.

The matching model can then be used to determine 406 properties of a bid request relevant to the query content item based at least on the properties of the query content item. A bid request can be generated 408 by populating a bid request schema or template with the determined properties of the bid request. In some embodiments, the content server may utilize a specific bid request schema or template, which defines a certain format for a bid request that can be processed by the content server.

Figure 5:
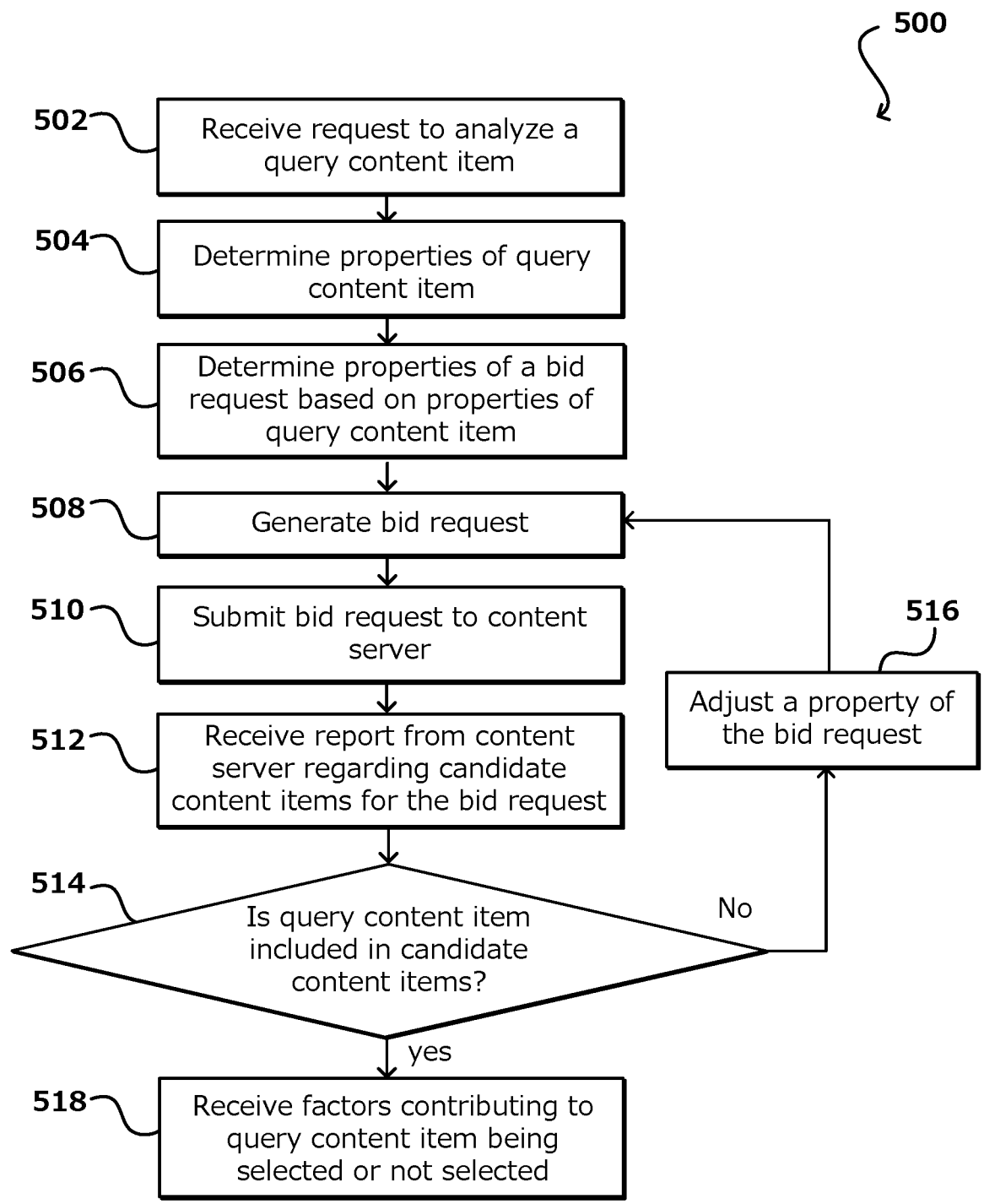
FIG. 5 illustrates a flow diagram of an example process for determining a cause of underdelivery of a query content item, in accordance with various embodiments.

FIG. 5 illustrates a flow diagram of an example process 500 for determining a cause of underdelivery of a query content item, in accordance with various embodiments. The example process 500 is provided merely as an example and additional or fewer steps may be performed in similar or alternative orders, or in parallel, within the scope of the various embodiments described in this specification. In various embodiments, an analysis system may receive 502 a request to analyze a query content item, such as to determine a cause of underdelivery for the query content item. The request may be initiated by an paid content provider who has noticed that a budget is not being fully spent and wants to know the root cause so rectifying adjustments can be made. Alternatively, the request may be made by a content server automatically upon detecting that a content item that the content server represents is being underdelivered. Properties of the query content item may then be determined 504. The request to the analysis system may include an identifier of the query content item, through which properties of the query content item can be accessed. In some embodiments, the query content item may be accessed via the identifier and a data representation of the query content item may be scanned or analyzed to extract the properties. Example properties of the query content item may include various parameters that define the ad, such as targeting expressions, commitment value information, ranking scores, size (e.g., pixel dimensions), the number of historical bids, clicks, and/or purchases, for example, resulting from the paid content item being presented, frequency caps, and/or pacing information, information regarding the content of the ad, information regarding the paid content provider, among others. Properties of a bid request can then be determined from the properties of the query content item 506. Specifically, the properties of the query content item can be processed through a matching model to determine properties of a bid request. The matching model may include matching rules that express estimated relationships between certain content item properties and bid request properties. Content item properties may include various parameters that define the ad, such as targeting expressions, commitment value information, ranking scores, size (e.g., pixel dimensions), the number of historical bids, clicks, and/or purchases, for example, resulting from the paid content item being presented, frequency caps, and/or pacing information, information regarding the content of the ad, information regarding the paid content provider, among others. Bid request properties may include information about a user operating the computing device on which the request was made and on which the winning content item is to be display, such as any behavioral or user segments that may describe various attributes of the user including, for example, demographics, gender, age, purchase history of products and/or services from various sources, any web content that is browsed or accessed by the user, paid content items or content in which the user demonstrated interest (e.g., through clicks, conversions, etc.), among other information. The bid request properties may also include data regarding the electronic content space, such as the size (e.g., pixel dimensions), the content surrounding the electronic content space, information regarding the publisher (e.g., publisher category, target audience), and other requirements such as cost per click, pace, frequency caps, among others. The content server representing the query content item may have specific logic or rules that the content server uses to select ads for bid requests. In some embodiments, the matching model may simulate the logic and rules. The matching model may include the exact logic and rules of the content server if such information is available, such as in the scenario of the content server and the analysis system belonging to the same entity or system. In some other embodiments, if the exact information is not available, the match model may include an estimation of the logic and rules of the content server. In such a scenario, the match model may be determined by reverse engineering the logic and rules of the content server. For example, the logic and rules of a content server may be estimated by analyzing relationships between properties of bid requests submitted to the content server and properties of ads selected by the content server in response to the bid requests, respectively.

In either case, properties of a bid request may be determined through the matching model based on the properties of the query content item. One the properties of the bid request are determined, the bid request can be generated 508. The properties of the bid request may be used to populate a bid request schema or template in order to generate a bid request that can be processed through the content item server as if the bid request were a live production bid request coming from a publisher. In various embodiments, the generated bid request also includes a request for the content server to return a report in response to the bid request that indicates which ads were considered to be selected for the bid request, a reason why a certain content item that was ultimately selected, and respective reasons why the other considered ads were ultimately not selected for the bid request. The reasons may be expressed as factors related to the properties of the ads. For example, the factors may be related to targeting expressions, the maximum cost per click, historical performance information, content of the ad, information related to the paid content provider, size or resolution, or any other properties of the query content item as well as other data associated with the query content item. A request for the content server to return such a report may be set as one of the properties of the generated bid request.

The bid request generated by the analyzer system may be submitted 510 to the content server, and in response, the content server defines a set of candidate content items and selects at least one of the candidate content items to submit bids on behalf of. The analyzer may also receive 512 the content item selection results from the content server, for example in the form of a report, including data representing the candidate content items. Specifically, the results (e.g., report) may indicate which one of the candidate content items was selected by the content server to bid on behalf of, and which of the candidate content items were not selected by the content server to bid on behalf of. Thus, a determination 514 can be made for whether the query content item was included in the candidate content items. If the query content item was not include in the candidate content items, an adjustment may be made to the bid request properties 516 and another bid request may be generated 508 and processed through the content server 510. For example, it may be hypothesized that a certain parameter of the bid request is too narrow or out of range to cause the content server to consider the query content item as a candidate content item, and thus the parameter can be updated to be broader or have a different range. If the query content item was included in the candidate content items, the analyzer may receive the aforementioned report from the content server 518, which may include factors contributing to respective ads being selected or not selected by the content server to bid on behalf of in response to the bid request. Thus, if the query content item is one of the ads that were not selected, the report would include factors contributing to the query content item not being selected, which may provide insight into the cause or reasons of underdelivery of the query content item. Such a report can serve as an analysis result in response to the request to analyze underdelivery of the query content item. In various embodiments, upon determining a cause of underdelivery of the query content item, a recommendation can be generated for improving the content item based on the determined cause. The recommendation may include changing certain parameters of the content item. For example, it may be that determined that certain keywords featured in the query content item were suboptimal for the bid requests to which the query content item should be responsive or intended to be responsive.

Figure 6:
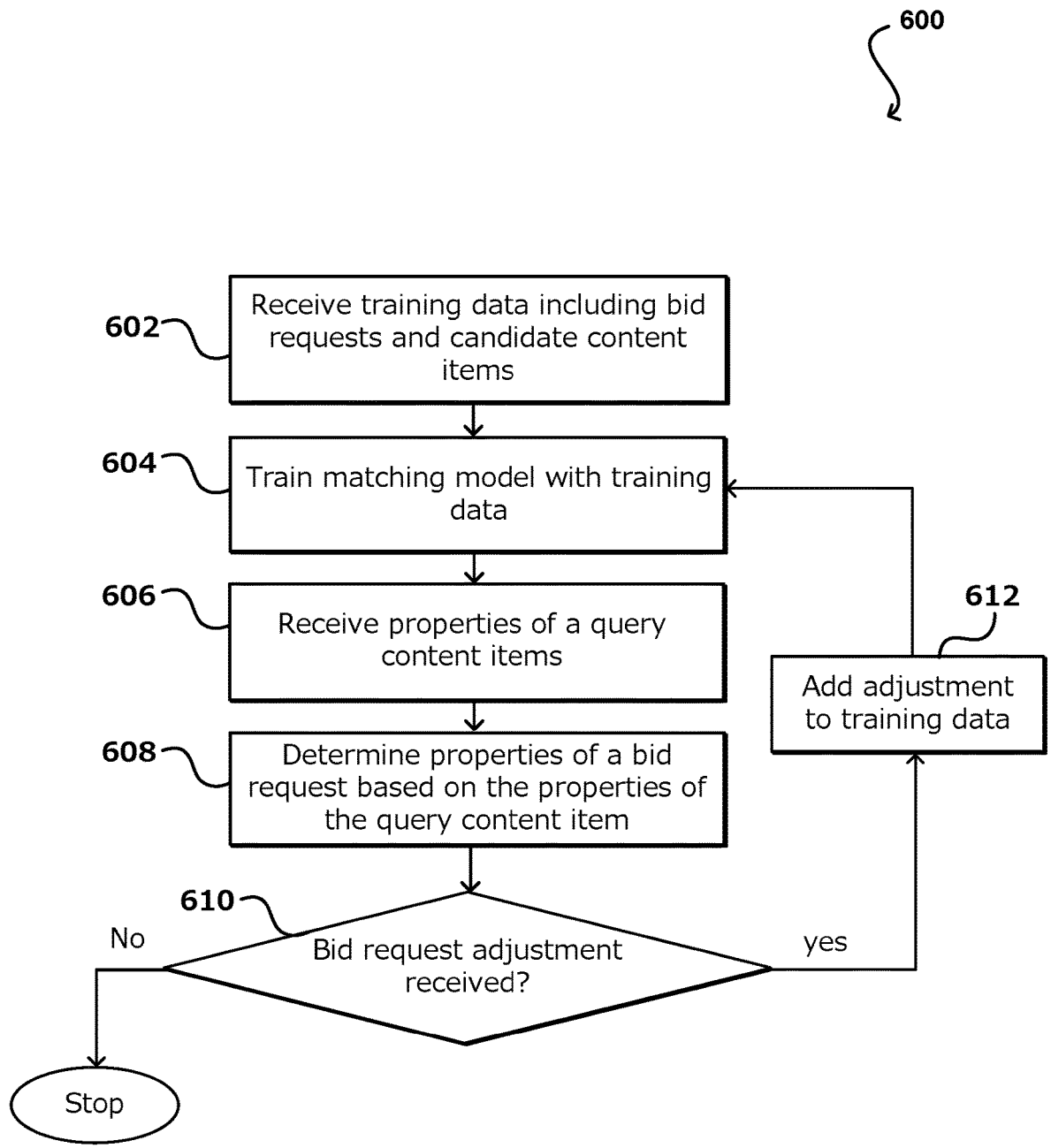
FIG. 6 illustrates a flow diagram of an example process for building a matching model, in accordance with various embodiments.

FIG. 6 illustrates a flow diagram of an example process 600 for building the matching model used to determine bid request properties from content item properties, in accordance with various embodiments. The example process 600 is provided merely as an example and additional or fewer steps may be performed in similar or alternative orders, or in parallel, within the scope of the various embodiments described in this specification. In various embodiments, a content server may have specific logic or rules that the content server uses to select ads for bid requests. The matching model is configured to simulate and reverse such logic and rules to be able to determine what type of bid request would is likely to cause the content server to select the query content item in response to receive that bid request, and thus be able to determine the properties of that bid request. In some other embodiments, the exact logic and rules of the content server is not available, and the match model may include an estimation of the logic and rules of the content server. In such a scenario, the match model may be determined by reverse engineering the logic and rules of the content server. For example, the logic and rules of a content server may be estimated by analyzing relationships between properties of bid requests submitted to the content server and properties of ads selected by the content server in response to the bid requests, respectively. In some embodiments, the matching model may include a machine learning model such as a neural network.

Specifically, referring to FIG. 6, such training data may be received 602 by the matching model. The training data may include a plurality of input-output pairs. An input-output pair may include a bid request received by the electronic content exchange as the input and a set of candidate content items, which includes the content item that is ultimate selected by the electronic content exchange to bid on behalf of and the ads that are not selected, as the output. In some embodiments, the matching model may be trained with the candidate content items as the input and the bid request as the output. Thus, a relationship between bid requests and content item selection can be learned and simulated by the matching model, thereby training to matching model to be able to determine properties for a bid request based on the properties of a query content item 604. Once the matching model is trained, an identifier and/or properties of a query content item can be received 606 and properties of a bid request can be determined 608 based on the properties of the query content item. In some embodiments, the properties of the bid request determined by the matching model may be adjusted by an annotator. Thus, it can be determined whether the bid request adjustment is received 610. This may be done to edit a certain property or adjust a certain property of the bid request. For example, it may be the case that when bid request generated by the bid simulator is submitted to the electronic content exchange, the candidate content items selected by the electronic content exchange does not include the query content item, and thus the report returned by the electronic content exchange may not include factors related to the query content item. For example, it may be hypothesized that a certain parameter of the bid request is too narrow or out of range to cause the content server to consider the query content item as a candidate content item, and thus the parameter can be updated to be broader or have a different range. If an adjustment is received, the adjustment, including any feedback or annotations made to a bid request generated by the matching model, may be added to the training data 612 and used to further train and refine the matching model 604. In various embodiments, there may be a limit to how many of the abovementioned iterations are permitted in a session (e.g., for one bid request) which may be implement using a counter for example, and the process may terminate once such a limit is reach.

Figure 7:
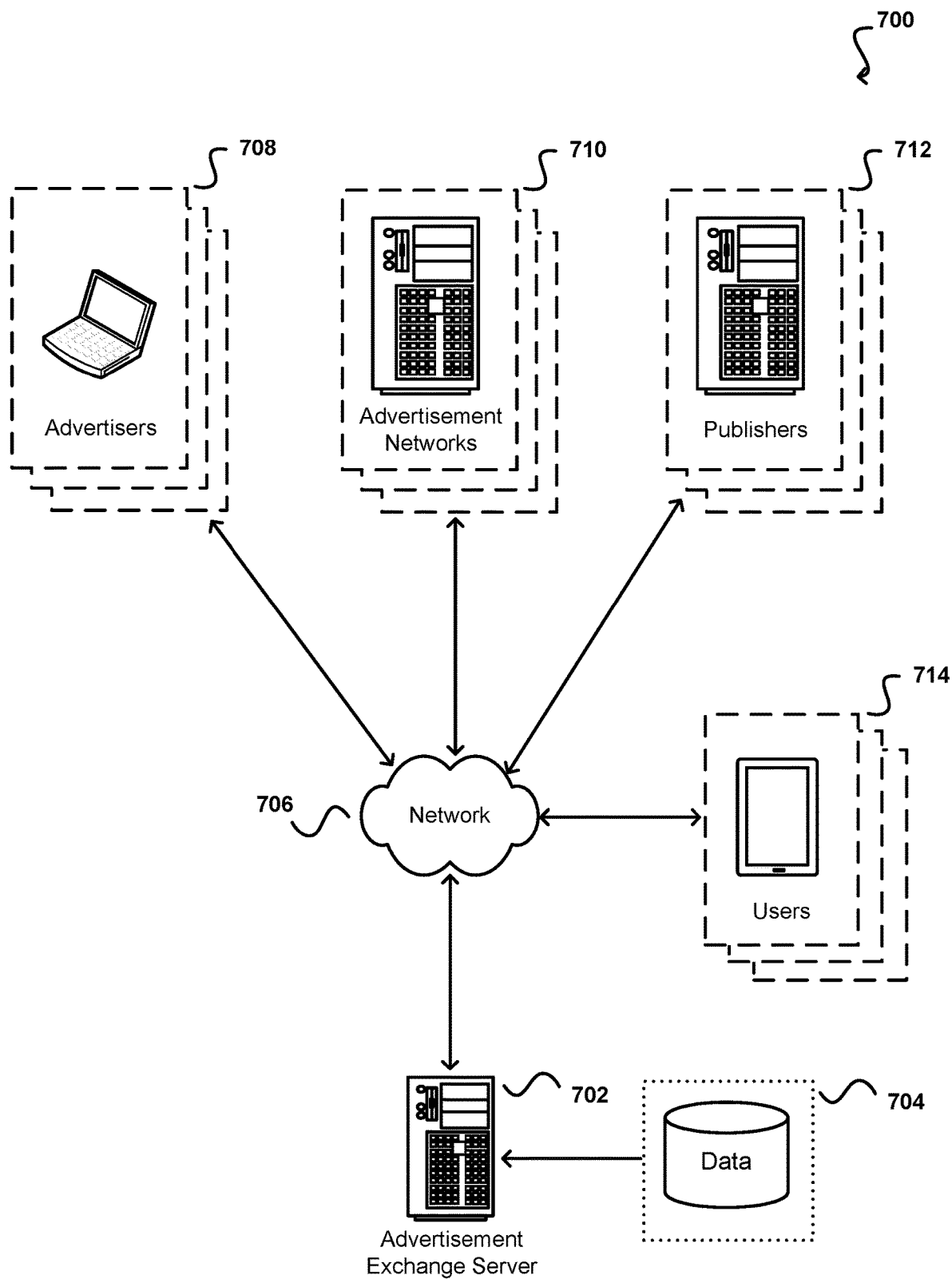
FIG. 7 illustrates an example environment for implementing aspects of the present disclosure in accordance with various embodiments.

In FIG. 7, the example environment 700 includes an electronic content server 702 (e.g., advertisement exchange server), paid content providers 708 (e.g., advertisers), paid content networks 710 (e.g., ad networks), content publishers 712 (e.g., websites, applications), and users 714 of users accessing content publishers. The content server 702 may be in communication with the electronic content exchange described in reference to FIG. 1 or the content server 702 and the electronic content exchange of FIG. 1 may be implemented together using one or more computing systems. Paid content providers 708, paid content networks 710, and publishers 712 are able to utilize respective computing systems and/or devices to interact with the content server 702 through the network 706, for example, a local area network (LAN) or wide area network (WAN), e.g., the Internet. Similarly users 714 are able to utilize their respective computing devices to access content (e.g., websites) that may be offered through the publishers 712 over the network 706. Such publishers 712 can provide content (e.g., web pages, etc.) that is accessible over the network 706 (e.g., the Internet). For example, a publisher 712 may utilize one or more computing systems to provide a website that is accessible through the network 706. The publisher's website may offer opportunities to present additional content to users accessing the website, for example, in the form of electronic paid content items. The computing devices and/or systems for each of the content server 702, paid content providers 708, paid content networks 710, publishers 712, users 714 will each generally include memory for storing instructions and data, and at least one processor for executing the stored instructions.

Typically, when a user 714 utilizes a computing device to access content from the publisher 712, the publisher's system can send, to the content server 702, a request for a paid content item to be presented with the content being accessed by the user, as described above. This request can include various information about the publisher 712 (e.g., type of content being provided, etc.), the user 714 (e.g., gender, age group, interests, etc.), and/or other contextual information (e.g., any search terms in a query submitted by the user, etc.) including a user identifier and/or digital profile, etc. Typically, the content server 702 can facilitate an electronic auction among the paid content providers 708 and/or ad networks 710 to automatically determine which paid content item should be provided to the publisher's system in response to the paid content item request. The content server 702 may obtain various information for facilitating the auction from a data store 704. Such an auction can generally be performed automatically among paid content providers that have paid content items associated with a respective estate corresponding to one or more advertising models that are associated with the user 714. Once the auction is complete, the winning paid content item is provided to the publisher's system in response to the paid content item request to be displayed, as an impression, with the publisher's content. The publisher's system can then provide the paid content item together with the content being browsed by the user 714. Various payment approaches may be utilized to pay the publisher. For example, a portion of the commitment value can be paid to the publisher per impression (i.e., cost per impression or cost per mille), per click (i.e., cost per click), per conversion, etc.

Figure 8:
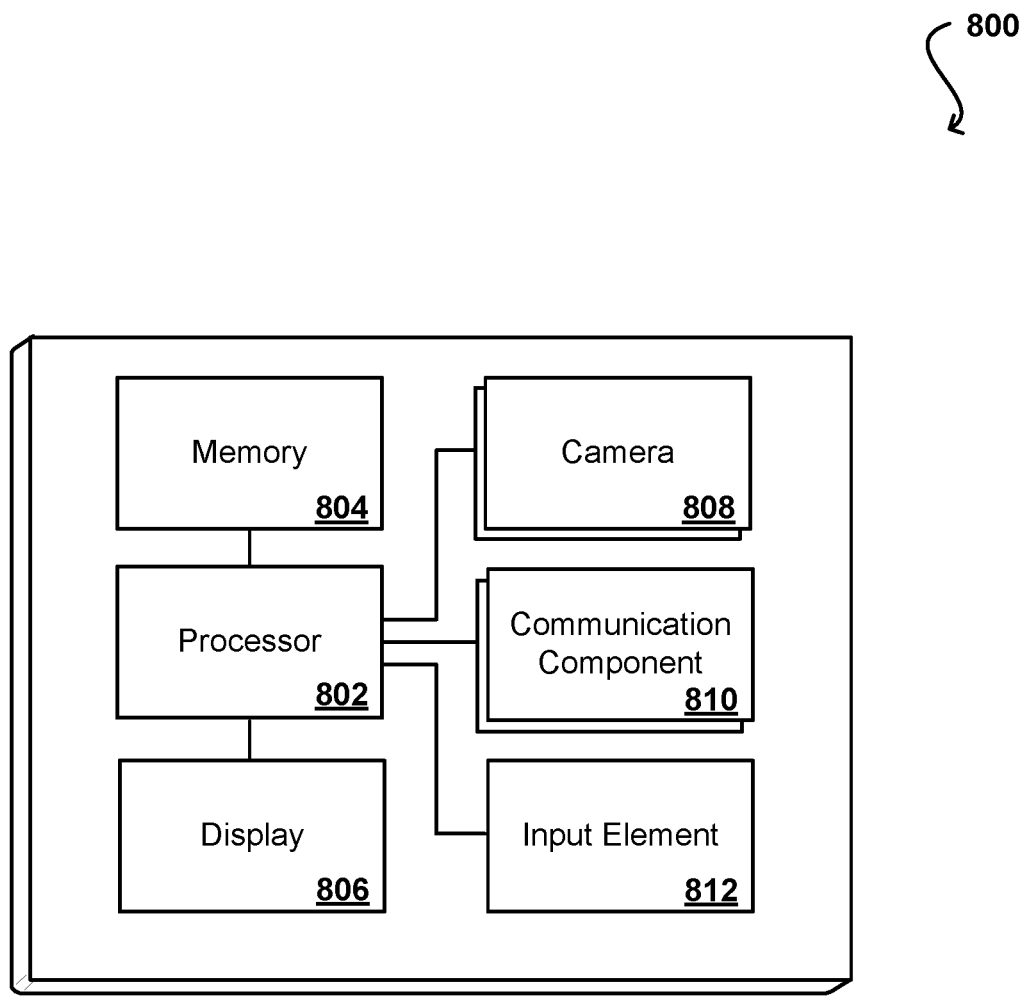
FIG. 8 illustrates example components of a computing device, in accordance with various embodiments.

FIG. 8 illustrates a logical arrangement of a set of general components of an example computing device 800. In this example, the device includes a processor 802 for executing instructions that can be stored in a memory device or element 804. As would be apparent to one of ordinary skill in the art, the device can include many types of memory, data storage, or non-transitory computer-readable storage media, such as a first data storage for program instructions for execution by the processor 802, a separate storage for images or data, a removable memory for sharing information with other devices, etc. The device typically will include some type of display element 806, such as a touch screen or liquid crystal display (LCD), although devices such as portable media players might convey information via other means, such as through audio speakers. As discussed, the device in many embodiments will include at least one image capture element 808 such as a camera or infrared sensor that is able to image projected images or other objects in the vicinity of the device. Methods for capturing images or video using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device. The example device similarly includes at least one audio capture component 812, such as a mono or stereo microphone or microphone array, operable to capture audio information from at least one primary direction. A microphone can be a uni- or omni-directional microphone as known for such devices.

In some embodiments, the computing device 800 of FIG. 8 can include one or more communication elements (not shown), such as a Wi-Fi, Bluetooth, RF, wired, or wireless communication system. The device in many embodiments can communicate with a network, such as the Internet, and may be able to communicate with other such devices. In some embodiments the device can include at least one additional input device able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device.

The device 800 also can include at least one orientation or motion sensor 810. As discussed, such a sensor can include an accelerometer or gyroscope operable to detect an orientation and/or change in orientation, or an electronic or digital compass, which can indicate a direction in which the device is determined to be facing. The mechanism(s) also (or alternatively) can include or comprise a global positioning system (GPS) or similar positioning element operable to determine relative coordinates for a position of the computing device, as well as information about relatively large movements of the device. The device can include other elements as well, such as may enable location determinations through triangulation or another such approach. These mechanisms can communicate with the processor 802, whereby the device can perform any of a number of actions described or suggested herein.

As an example, a computing device can capture and/or track various information for a user over time. This information can include any appropriate information, such as location, actions (e.g., sending a message or creating a document), user behavior (e.g., how often a user performs a task, the amount of time a user spends on a task, the ways in which a user navigates through an interface, etc.), user preferences (e.g., how a user likes to receive information), open applications, submitted requests, received calls, and the like. As discussed above, the information can be stored in such a way that the information is linked or otherwise associated whereby a user can access the information using any appropriate dimension or group of dimensions.

Figure 9:
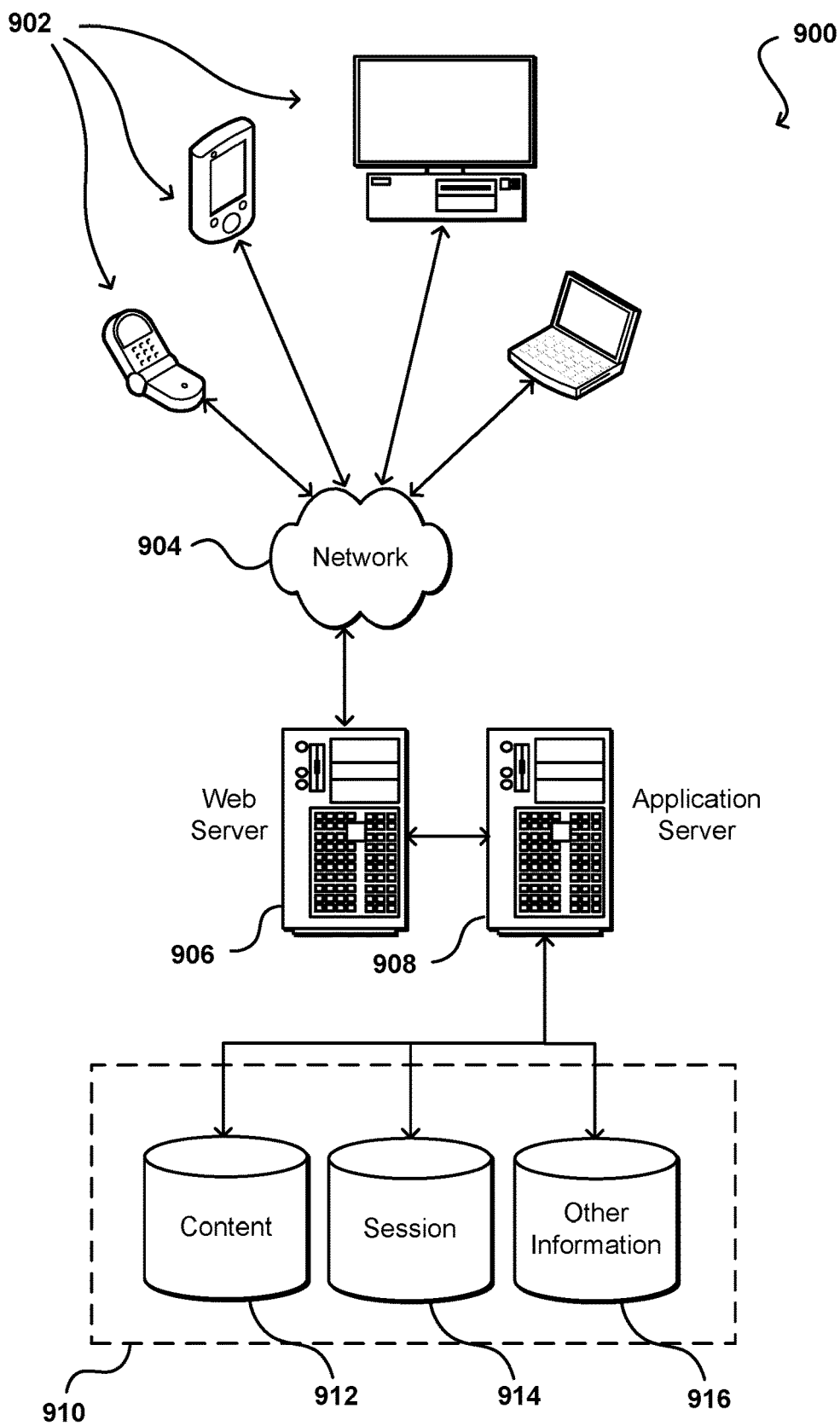
FIG. 9 illustrates an example environment for implementing aspects of the present disclosure in accordance with various embodiments.

As discussed, different approaches can be implemented in various environments in accordance with the described embodiments. For example, FIG. 9 illustrates an example of an environment 900 for implementing aspects in accordance with various embodiments. As will be appreciated, although a Web-based environment is used for purposes of explanation, different environments may be used, as appropriate, to implement various embodiments. The system includes electronic client devices 918, 920, 922, and 924, which can include any appropriate device operable to send and receive requests, messages or information over an appropriate network 904 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. The network could be a "push" network, a "pull" network, or a combination thereof. In a "push" network, one or more of the servers push out data to the client device. In a "pull" network, one or more of the servers send data to the client device upon request for the data by the client device. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server 906 for receiving requests and serving content in response thereto, although for other networks, an alternative device serving a similar purpose could be used, as would be apparent to one of ordinary skill in the art.

The illustrative environment includes at least one application server 908 and a data store 910. It should be understood that there can be several application servers, layers or other elements, processes or components, which may be chained or otherwise configured, which can interact to perform tasks such as obtaining data from an appropriate data store. As used herein, the term "data store" refers to any component or combination of components capable of storing, accessing and retrieving data, which may include any combination and number of data servers, databases, data storage components and data storage media, in any standard, distributed or clustered environment. The application server 908 can include any appropriate hardware and software for integrating with the data store 910 as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server 906 in the form of HTML, XML or another appropriate structured language in this example. The handling of all requests and responses, as well as the delivery of content between the client devices 918, 920, 922, and 924 and the application server 908, can be handled by the Web server 906. It should be understood that the Web and application servers are not required and are merely example components, as structured code discussed herein can be executed on any appropriate device or host machine as discussed elsewhere herein.

The data store 910 can include several separate data tables, databases or other data storage mechanisms and media for storing data relating to a particular aspect. For example, the data store illustrated includes mechanisms for storing content (e.g., production data) 912 and other information 916 (e.g., anonymized user information), which can be used to serve content for the production side. The data store is also shown to include a mechanism for storing log or session data 914. It should be understood that there can be many other aspects that may need to be stored in the data store, such as page image information and access rights information, which can be stored in any of the above listed mechanisms as appropriate or in additional mechanisms in the data store 910. The data store 910 is operable, through logic associated therewith, to receive instructions from the application server 908 and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on anyone of the user devices 918, 920, 922 and 924. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 9. Thus, the depiction of the system 900 in FIG. 9 should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized components, each such component can include hardware elements that may be electrically coupled via a bus, the elements including, for example, at least one central processing unit (CPU), at least one input component (e.g., a mouse, keyboard, controller, touch-sensitive display element or keypad) and at least one output component (e.g., a display component, printer or speaker). Such a system may also include one or more storage components, such as disk drives, optical storage components and solid-state storage components such as random access memory (RAM) or read-only memory (ROM), as well as removable media components, memory cards, flash cards, etc.

Such devices can also include a computer-readable storage media reader, a communications component (e.g., a modem, a network card (wireless or wired), an infrared communication component) and working memory as described above. The computer-readable storage media reader can be connected with, or configured to receive, a computer-readable storage medium representing remote, local, fixed and/or removable storage components as well as storage media for temporarily and/or more permanently containing, storing, transmitting and retrieving computer-readable information. The system and various devices also typically will include a number of software applications, modules, services or other elements located within at least one working memory component, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage components or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computing system, comprising:
   at least one computing device processor; and
   a memory device including instructions that, when executed by the at least one computing device processor, cause the computing system to:
   receive a request to troubleshoot underdelivery of an underdelivered content item by a content server, wherein previous spending for the underdelivered content item is below a threshold amount;
   determine properties of the underdelivered content item;
   generate a bid request for the content server to provide a content item, the bid request generated based on at least a subset of the properties of the underdelivered content item, a bid request schema and matching rules associated with the content server, the matching rules defining how the content server selects content items in response to bid requests, the bid request including a request for an underdelivery report;
   submit the bid request to the content server;
   cause the content server to define a set of candidate content items for the bid request, the set including at least one of a selected content item and an unselected content item, the unselected content item including the underdelivered content item;
   receive the underdelivery report from the content server; and
   determine, based on the underdelivery report, one or more factors that contributed to the underdelivered content item not being selected in response to the bid request;
   generate, based at least in part on the one or more factors that contributed to the underdelivered content item not being selected, a recommendation for improving delivery of the underdelivered content item; and
   adjust, based on the recommendation, at least one of the properties of the underdelivered content item.

2. The computing system of claim 1, wherein the underdelivery report includes a reason for the underdelivered content item not being selected.

3. The computing system of claim 1, wherein the instructions when executed further cause the computing system to:

generate a plurality of bid requests based at least in part on the underdelivered content item, individual bid requests in the plurality of bid requests having at least one property different from other individual bid requests in the plurality of bid requests;

submit the plurality of bid requests through the content server, the content server determining a plurality of sets of candidate content items in response to the plurality of bid request, respectively;

receive, from the content server, for individual bid requests of the plurality of bid requests, at least one factor contributing to a selection status of the underdelivered content item; and aggregate the factors received from the content server for the plurality of bid requests.

4. The computing system of claim 1, wherein the instructions when executed further cause the computing system to:
define the matching rules based at least on an estimation of logic used by the content server to define candidate and selected paid content items in response to bid requests.

5. A computing system, comprising:
at least one computing device processor; and
a memory device including instructions that, when executed by the at least one computing device processor, cause the computing system to:
determine properties of an underdelivered content item, wherein previous spending for the underdelivered content item is below a threshold amount;
determine properties of a bid request based at least in part on the properties of the underdelivered content item, the properties of the bid request and the properties of the underdelivered content item associated via a matching model associated with a content server;
generate the bid request;
submit the bid request to the content server, the content server determining a set of candidate content items in response to the bid request, the set of candidate content items including at least one of a selected content item or an unselected content item, the underdelivered content item being among the candidate content items;
receive, from the content server, data representing the set of candidate content items and information associated with the set of candidate content items;
determine, based on the data received from the content server, one or more factors that contributed to whether the underdelivered content item is a selected content item or an unselected content item in response to the bid request;
generate, based at least in part on the one or more factors that contributed to whether the underdelivered content item is a selected content item or an unselected content item, a recommendation for improving delivery of the underdelivered content item; and
adjust, based on the recommendation, at least one of the properties of the underdelivered content item.

6. The computing system of claim 5, wherein the information includes the one or more factors contributing to the selected content item being selected and the unselected content item being unselected.

7. The computing system of claim 6, wherein the instructions when executed further cause the computing system to:
generate a user-readable notification based at least in part on the information.

8. The computing system of claim 6, wherein the instructions when executed further cause the computing system to:
determine at least one of the properties of the underdelivered content item to adjust based at least in part on the factors, adjustment of the at least one of the properties associated with the selected content item being selected.

9. The computing system of claim 5, wherein the instructions when executed further cause the computing system to:
determine that the underdelivered content item is not included in the candidate content items;
adjust a property of the underdelivered content item or the bid request;
process the bid request through the content server again following the adjustment; and
determine a factor contributing to the underdelivered content item not being included in the candidate content items.

10. The computing system of claim 5, wherein the content server includes logic for matching content items to bid requests, and the matching model is an estimation of the logic.

11. The computing system of claim 5, wherein the instructions when executed further cause the computing system to:
generate the matching model based on training data including a plurality of bid requests and a plurality of sets of candidate content items respectively matched with the bid requests by the content server.

12. The computing system of claim 5, wherein the instructions when executed further cause the computing system to:
receive an adjustment to the properties of the bid request; and
update the matching model based at least in part on the adjustment.

13. The computing system of claim 5, wherein the bid request is a first bid request the set of candidate content items is a first set of candidate content items, and wherein the instructions when executed further cause the computing system to:
generate a second bid request based at least in part on the properties of the underdelivered content item, the second bid request having at least one property different from the first bid request;
process the second bid request through the content server, the content server determining a second set of candidate content items in response to the second bid request, the second set of candidate content items comprising at least one of a selected content item or an unselected content item;
receive, from the content server, data representing a second set of candidate content items and information associated with the second set of candidate content items;
aggregate the information associated with the first and second sets of content items; and
determine, based at least on the information associated with the first and second sets of content items, one or more factors associated with underdelivery of the underdelivered content item.

14. The computing system of claim 5, wherein the instructions when executed further cause the computing system to:
populate a bid request schema with the properties of the bid request to generate the bid request.

15. The computing system of claim 5, wherein the properties of the underdelivered content item includes at least one of an advertising targeting parameter or an aspect of the content contained therein.

16. The computing system of claim 5, wherein the selected content item is selected by the content server in response to the bid request, the bid request associated with a content region of a web site or application.

17. A computer-implemented method, comprising:
determining properties of an underdelivered content item, wherein previous spending for the underdelivered content item is below a threshold amount;
determining properties of a bid request based at least in part on the properties of the underdelivered content item, the properties of the bid request and the properties of the underdelivered content item associated via a matching model associated with a content server;
generating the bid request;
submitting the bid request to the content server, the content server determining a set of candidate content items in response to the bid request, the set of candidate content items including at least one of a selected content item or an unselected content item, the underdelivered content item being among the candidate content items;
receiving, from the content server, data representing the set of candidate content items and information associated with the set of candidate content items;
determining, based on the data received from the content server, one or more factors that contributed to whether the underdelivered content item is a selected content item or an unselected content item;
generating, based at least in part on the one or more factors that contributed to whether the underdelivered content item is a selected content item or an unselected content item, a recommendation for improving delivery of the underdelivered content item; and
adjusting, based on the recommendation, at least one of the properties of the underdelivered content item.

18. The computer-implemented method of claim 17, wherein the underdelivered content item is included in the unselected content items, and the information includes factors contributing to the underdelivered content item being unselected.

19. The computer-implemented method of claim 18, further comprising:
determining that the underdelivered content item is not included in the candidate content items;
adjusting a property of the underdelivered content item or the bid request;
processing the bid request through the content server again following the adjustment; and
determining a factor contributing to the underdelivered content item not being included in the candidate content items.

20. The computer-implemented method of claim 18, further comprising:
generating the matching model based on training data including a plurality of bid requests and a plurality of sets of candidate content items respectively matched with the bid requests by the content server.

* * * * *